United States Patent

Chen et al.

[11] Patent Number: 6,048,794
[45] Date of Patent: Apr. 11, 2000

[54] SELECTIVE W CVD PLUG PROCESS WITH A RTA SELF-ALIGNED W-SILICIDE BARRIER LAYER

[75] Inventors: Hsueh-Chung Chen, Taipei; Chine-Gie Lou, Hsinchu, both of Taiwan

[73] Assignee: Industrial Technology Research Institute, Hsin-Chu, Taiwan

[21] Appl. No.: 08/954,048

[22] Filed: Oct. 20, 1997

[51] Int. Cl.[7] ................................................. H01L 21/44
[52] U.S. Cl. .......................... 438/675; 438/682; 438/683; 438/785; 438/787
[58] Field of Search ..................................... 438/630, 645, 438/649, 624, 675, 682, 683, 785, 787

[56] References Cited

U.S. PATENT DOCUMENTS

| | | | |
|---|---|---|---|
| 5,554,565 | 9/1996 | Liaw et al. | 438/624 |
| 5,599,739 | 2/1997 | Merchant et al. | 437/190 |
| 5,604,158 | 2/1997 | Cadien et al. | 437/200 |
| 5,627,400 | 5/1997 | Koga | 257/529 |

*Primary Examiner*—David Nelms
*Assistant Examiner*—Reneé R. Berry
*Attorney, Agent, or Firm*—George O. Saile; Stephen B.. Ackerman; William J. Stoffel

[57] ABSTRACT

The present invention provides a method of fabricating a tungsten (W) plug 36 contact to a substrate using a selective W CVD Process with a self-aligned W-Silicide Barrier layer 34. The method comprises the steps of: forming first insulating layer 20 over a silicon semiconductor substrate 10; forming a first (contact) opening 24 in the first insulating layer 20 exposing the surface of the substrate; selectively growing a thin first tungsten layer 30 over the exposed substrate surface; rapidly thermally annealing the substrate forming a thin first tungsten silicide layer 34 from the thin first tungsten layer 30; selectively depositing a tungsten plug 36 over the first thin tungsten silicide layer 34 substantially filling the first opening 36 thereby forming a W plug contact. The RTA/W silicide layer 34 lowers the contact resistance, increases the adhesion and facilitates the selective deposition of the W plug 36.

18 Claims, 2 Drawing Sheets

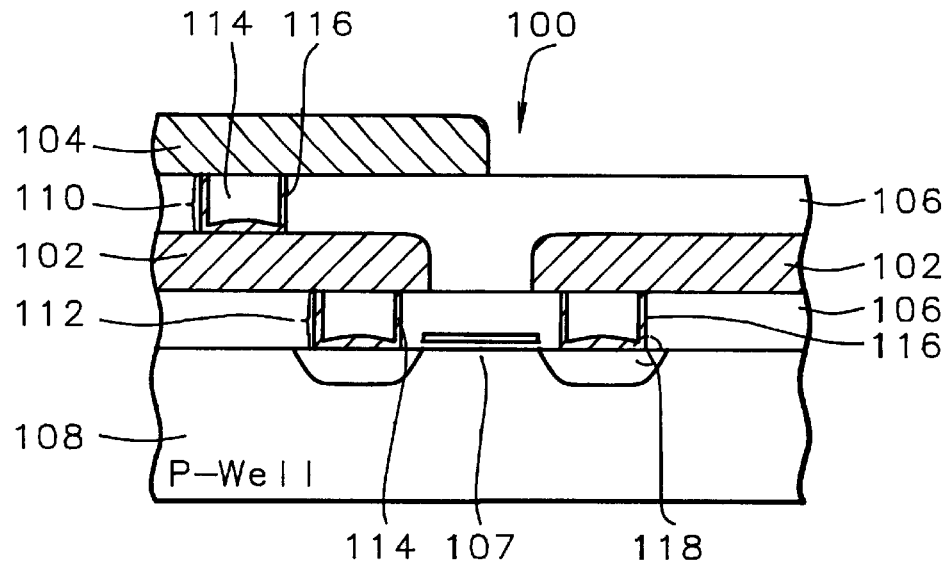
FIG. 1A – Prior Art
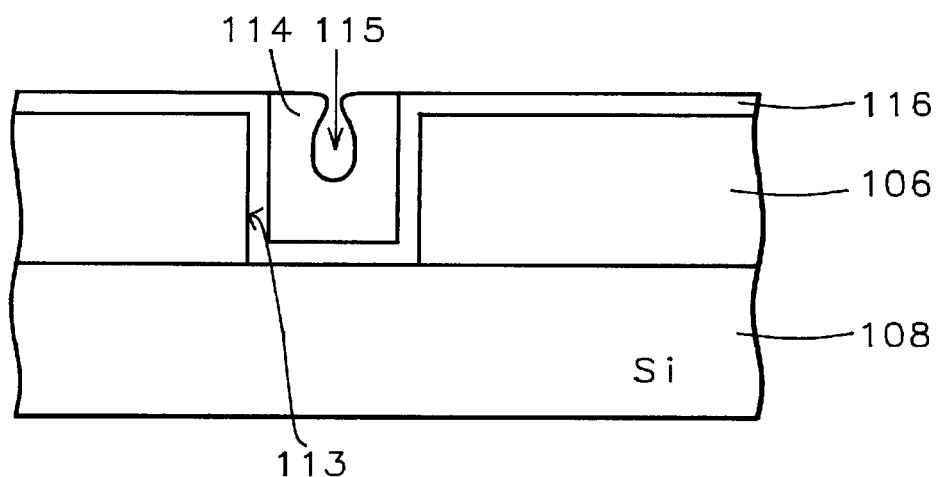
FIG. 1B – Prior Art
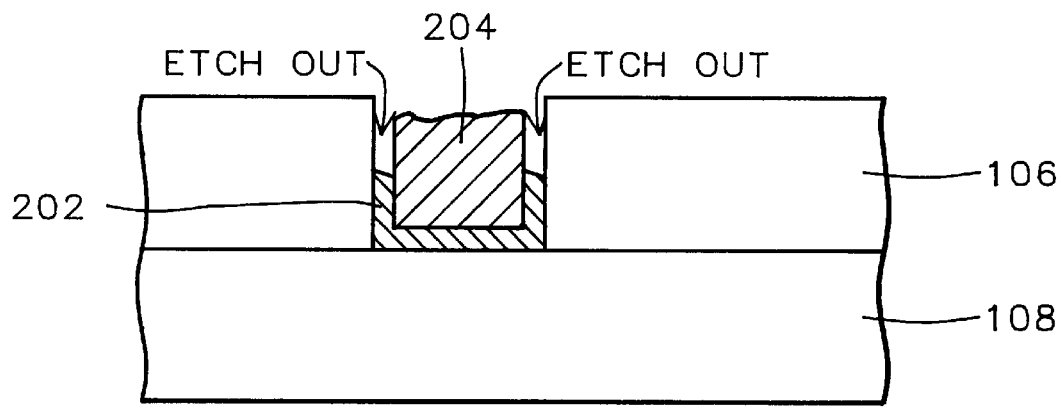
FIG. 1C – Prior Art

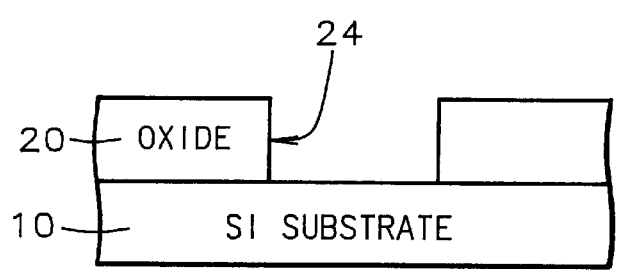
FIG. 2
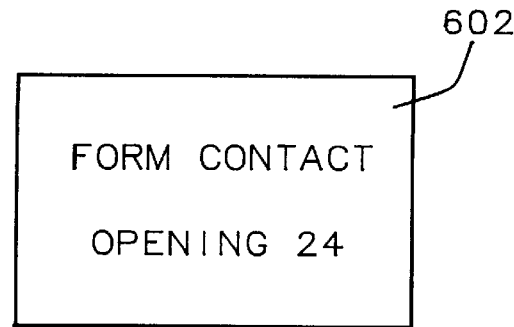
FORM CONTACT OPENING 24
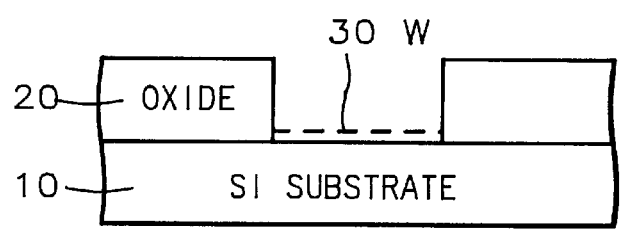
FIG. 3
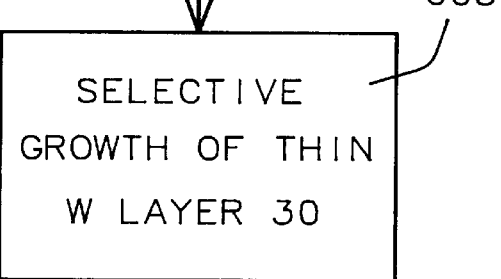
SELECTIVE GROWTH OF THIN W LAYER 30
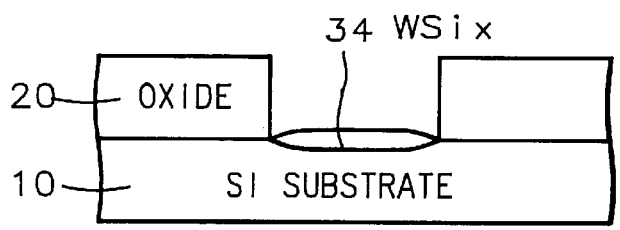
FIG. 4
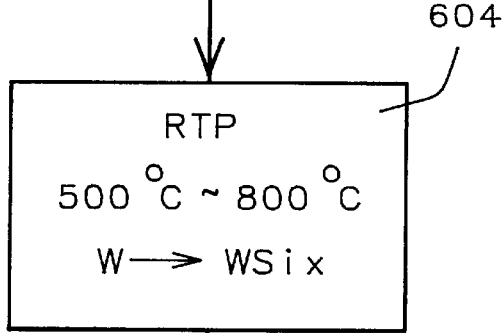
RTP 500°C ~ 800°C W → WSix
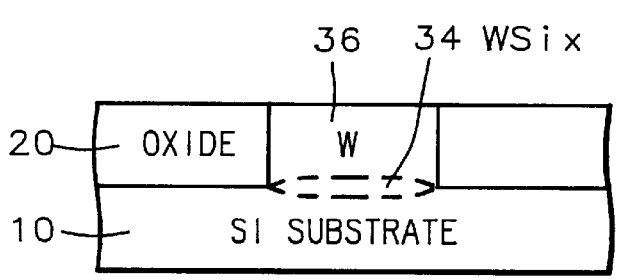
FIG. 5
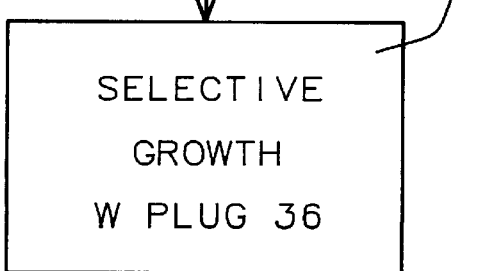
SELECTIVE GROWTH W PLUG 36
FIG. 6

SELECTIVE W CVD PLUG PROCESS WITH A RTA SELF-ALIGNED W-SILICIDE BARRIER LAYER

BACKGROUND OF INVENTION

1. Field of the Invention

The present invention relates to the field of semiconductor circuit manufacturing, and more specifically, to a method of forming an electrical connection (contact) between the substrate and a conductive layer and more particularly to a process for forming a W Plug contact using a selective growth technique.

2. Description of the Prior Art

Semiconductor integrated circuits are made up of millions of active devices formed in or on a silicon substrate or well. The active devices are connected together in order to form functional circuits and components from the devices. The devices are connected together using contacts and multilevel interconnects. A cross-sectional illustration of a typical multilevel interconnect structure 100 is shown in FIG. 1A. Interconnect structures normally have a first level of metallization or interconnect layer 102 (typically aluminum alloys or tungsten), a second level of metallization 104 and sometimes a third or even fourth level of metallization. Interlevel dielectrics 106 (ILDS) such as silicon dioxide ($SiO_2$) are used to electrically isolate different levels of metallization and silicon substrate or well 108. The electrical connections between different interconnect levels are made through the use of metalized vias 110 formed in ILD 106.

In a similar manner, metal contacts 112 are used to form electrical connections between interconnect levels and devices formed in well 108. The metal vias 110 and contacts 112, herein after being commonly referred to as "vias", are generally filled with tungsten 114 and generally have a titanium nitride (TiN) barrier layer 116. Titanium nitride barrier layer 116 provides an adhesion layer for tungsten metal 114. It is to be appreciated that tungsten exhibits poor adhesion to materials such as oxides, metals, silicon, and silicides.

As shown in FIG. 1B, in the conventional W plug process, a barrier layer 116 is formed over in the contact hole 113 and over the insulating layer surface. Next, tungsten is blanket deposited in the contact hole 113 and over the insulating layer surface 106. The tungsten layer is then "etched back". In small dimension contact hole or high aspect holes, the W layer 114 can form "keyholes" 115 which can cause reliability and yield problems. In addition, as the contact hole 113 diameter get smaller, the adhesion layer 116 takes more space thus making the aspect higher and worsening the "keyhole" problem. In the near future, at some small contact diameter, the adhesion layer on the contact hole sidewalls will not be used because it takes up too much space and caused keyhole tungsten defects.

A problem with metalized vias 110 and 112 is that the titanium nitride (TiN) adhesion layer is formed by sputtering. Sputter processes classically exhibit poor step coverage 118 as shown in FIG. 1A. Poor step coverage in vias translates into reliability (open circuits) and performance (increased resistance) problems for the interconnect structure. Step coverage becomes worse and reaches an unacceptable level as via dimensions decrease in order to facilitate higher density circuits. The problem is especially compounded when small dimensioned vias with vertical sidewalls are formed. Sputtered titanium nitride barrier layers can only be reliably used in vias with aspect ratios less than about 3.0. Sputtered titanium nitride barrier layers are incompatible with future ultra large-scale integrated (ULSI) circuits which will require vias with aspect ratios >4.0.

A chemical vapor deposited (CVD) titanium nitride adhesion layer has been suggested as a substitute for the sputtered titanium nitride adhesion layer. CVD processes generally exhibit better step coverage than do sputter processes. Unfortunately, CVD titanium nitride requires a TiCl, high temperature process (600° C.). Such a high temperature process is incompatible with some layers utilized in multi-level metallization schemes. Additionally, chlorine from $TiCl_4$ can be incorporated into the barrier layer and detrimentally affect its quality. Still further, CVD titanium nitride requires costly and elaborate machinery.

As an alternative to titanium nitride adhesion layers, tungsten silicide (WSi), adhesion layers have been proposed. Unfortunately, a tungsten via formed with a tungsten silicide adhesion layer suffers from "etch out" as shown in FIG. 1C. That is, presently there is no plasma etch chemistry which can be used to etch back the tungsten layer which does not preferentially attack the tungsten silicide adhesion layer 202 and cause etch out. If the adhesion layer is etched away, the tungsten metal can "pop out" and cause a failure. Another problem with the plasma etchback process shown in FIG. 1C is that the tungsten metals 204 can become recessed into the via hole during etchback. Such a recessed plug can adversely effect the planarization of subsequently formed interconnect layers. Thus, the use of a tungsten via in conjunction with a tungsten silicide adhesion layer is presently an unreliable process.

Thus, what is desired is a method of forming a reliable tungsten plug which can be used in modem, high density, multilevel integrated circuits.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,604,158 (Cadien et al.) shows an integrated tungsten/W silicide plug process where a tungsten layer is deposited onto a tungsten-silicide layer. U.S. Pat. No. 5,599,739 (Merchant et al.) shows methods for forming tungsten over tungsten-silicide layers.

However, there is still a need for a method to form W plugs for small diameter openings without adhesion layers on the sidewalls of contact holes and forms contacts with lower resistance.

SUMMARY OF THE INVENTION

It is an object of the present invention to provide a method for fabricating a tungsten Plug contact to a silicon substrate using a selective tungsten chemical vapor deposition (CVD) process that allows filling of smaller dimension contact openings.

It is an object of the present invention to provide a method for fabricating a tungsten plug contact using a selective tungsten chemical vapor deposition process with a RTP self-aligned W-Silicide barrier layer.

To accomplish the above objectives, the present invention provides a method of fabricating a tungsten (W) plug contact to a substrate using a selective tungsten (W) chemical vapor deposition (CVD) Process with a self-aligned W-Silicide Barrier. The method comprises the steps of:

a) forming first insulating layer 20 over a silicon semiconductor substrate 10;

b) FIG. 2—forming a first (contact) opening 24 in the first insulating layer 20 exposing the surface of the substrate; the first opening 24 preferably has an width (open dimension) in a range of between about 0.15 and 0.2 μm and more preferably of less than 0.2 μm.

c) FIG. 13—selectively growing a thin first tungsten layer 30 over the exposed substrate surface; the thin first tungsten layer 30 having a thickness in a range of about 200 and 500 Å;

d) FIG. 4—rapidly thermally annealing the substrate forming a thin first tungsten silicide layer 34 from the thin first tungsten layer 30; the rapidly thermal anneal of the substrate performed at a temperature in a range of between about 500 and 800° C. and for a time in a range of about 15 and 60 sec (tgt>30 seconds);

e) FIG. 5—selectively depositing a tungsten plug 36 over the first thin tungsten silicide layer 34 substantially filling the first opening 36.

The invention provides a method of forming a tungsten plug contact using a selective W CVD Process with RTP (Rapid thermal process) self-aligned W-Silicide Barrier layer 34. The invention overcomes many of the problems of the prior art and has many yield and cost advantages compared to the conventional methods. The selective W-plug deposition of the invention eliminates the need for an tungsten etch back process thus eliminating the adhesion layer etch out problem. The method also reduces the W plug seam and keyhole problems.

The invention's tungsten silicide barrier layer 34 of the invention increases the conductivity of the contact thus producing faster devices. The invention's tungsten silicide barrier layer 34 eliminates the need for a TiW or TiN "glue layer" thus allowing the formation of smaller plug contacts. The elimination of the barrier layer on the contact opening sidewalls allows more space in the contact hole for the tungsten plug. This extra space is needed as the diameter of the contact plug opening is reduced. This reduces the "keyhole" problem and allows formation of w plugs in smaller diameter contact and via openings. Also, because the tungsten silicide barrier layer 34 can be used as a glue layer (to improve W adhesion to the substrate), the selective deposition of the W plug is easier and has a wider process window.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A through 1C are cross sectional views for illustrating a method for manufacturing a plug contact according to the prior art.

FIGS. 2 through 5 are cross sectional views for illustrating a method for manufacturing a plug contact of a semiconductor memory device according to the present invention.

FIG. 6 is a flow chart of the steps (602, 603, 604, 605) shown in FIGS. 2 through 5 of the process of the invention.

DETAILED DESCRIPTION OF THE PREFERRED EMBODIMENTS

The present invention will be described in detail with reference to the accompanying drawings. The present invention provides a method of fabrication of a tungsten (W) plug contact to a substrate using a selective W CVD Process with a self-aligned W-Silicide Barrier.

The process of the invention can be summarized as shown in the table 1 below:

TABLE 1

Process summary

FIG. 2 - form first insulating layer 20 over substrate 10
FIG. 2 - form contact opening 24
FIG. 3 - selectively grow a thin W layer 30 on the substrate surface
FIG. 4 - Rapid Thermal Anneal the thin W layer 30 to form a tungsten silicide layer 34 in contact opening 24
FIG. 5 - Selectively grow W plug on Tungsten silicide layer 24 in contact opening 24

As shown in FIG. 2, a first insulating layer 20 is formed over a silicon semiconductor substrate 10.

The substrate 10 is understood to possibly include a semiconductor wafer, active and passive devices formed within the wafer and layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and/or metallurgy lines.

The first insulating layer 20 preferably has a thickness in a range of between about 8000 and 10,000 Å and is preferably composed of a material selected from the group consisting of phosphosilicate glass, borophosphosilicate glass (BPSG), and undoped $SiO_2$ and is more preferably formed of a three layer sandwich structure composed of: (1) a lower undoped silicate glass layer (USG), (2) a middle BPSG layer, and (3) a upper undoped silicate glass layer (all three layers shown as layer 20).

As shown in FIG. 2, first (contact) opening 24 is formed in the first insulating layer 20 exposing the surface of the substrate. The first opening 24 preferably has an width (open dimension) in a range of between about 0.15 and 0.2 μm and more preferably of less than 0.2 μm. The contact opening can have any shape.

As shown in FIG. 3, in an important step, a thin first tungsten layer 30 is selectively grown over the exposed substrate surface. The thin first tungsten layer 30 preferably has a thickness in a range of between about 200 and 500 Å and more preferably of about 300 Å.

The thin first tungsten layer 30 is selectively deposited using $H_2$ gas at a flow between about 1500 and 2500 sccm, and $WF_6$ at a flow between about 50 and 150 sccm, at a temperature between about 380 and 430° C. and more preferably between 380 and 400° C., and at a pressure between about 150 mtorr and 250 mTorr, and at a deposition rate between about 200 and 500 Å/min, and can be performed in an appropriate reactor, such as in a cold wall Genus 8402/4 system.

The invention's first tungsten layer 30 is selectively grown over the substrate because the Silicon substrate surface serves as nucleation area. The oxide layer 20 does not serve as a nucleating layer. The reaction is as follows: 2 WF6+3Si→2W+3SiF4. Therefore, no reaction will take place on $SiO_2$ layer 20 because there is no available Si to react.

Referring to FIG. 4, the substrate is rapidly thermally annealed thereby forming a thin first tungsten silicide layer 34 (e.g., barrier layer 34) from the thin first tungsten layer 30. The rapid thermal anneal of the substrate is preferably performed at a temperature in a range of between about 500 and 800° C. and more preferably between about 650 and 750° C. in a Ar gas flow for a time in a range of between about 15 and 60 sec (tgt>30 seconds). The invention's layer 34 acts as a glue layer (e.g., adhesion layer) as well as a barrier layer, and widens the process window for the subsequent W plug process.

Still referring to FIG. 5, a tungsten plug 36 is selectively deposited over the first thin tungsten silicide layer 34 and substantially fills the first opening 36. The tungsten is not deposited on the first insulating layer. A layer of tungsten (W) is selectively grown in the opening (or via) by a reduced-pressure CVD method preferably using a reduction reaction between $WF_6$ (tungsten hexafluoride) gas and $H_2$ gas. Alternatively, a reduction reaction between $WF_6$ gas and $SiH_4$ (silane) gas can be used. Reactants $SiH_4$ and WF6 are preferred. This selective deposition eliminates the need for a etch back step. The selectively deposition of the tungsten plug 36 performed using $SiH_4$ and $WF_6$ with a $SiH_4$ to $WF_6$ ratio in a range between about 0.55 and 1.3 and more preferably greater than 1.0 and at a pressure in a range of between about 175 and 225 mtorr and more preferably about 200 mtorr and at a deposition rate between about 400 and 6000 Å/min and more preferably about 5000 Å/min.

The tungsten plug 36 preferably has a thickness in a range of between about 5000 and 6000 Å and more preferably about 5000 Å.

The invention provides a method of forming a tungsten Plug contact using a Selective W CVD process with RTP self-aligned W-Silicide barrier layer. The invention overcomes many of the problems of the prior art. The invention has may yield and cost advantages compared to the conventional methods. The selective W-plug 36 deposition of the invention eliminates the need for a tungsten etch back process thus eliminating the adhesion layer etch out problem. The method also reduces the W plug seam and keyhole problems.

The invention's tungsten silicide barrier layer 34 of the invention increasing the conductivity of the contact thus producing faster devices. The invention's tungsten silicide barrier layer 34 eliminates the need for a TiW or TiN "glue layer" thus allowing the formation of smaller plug contacts. The elimination of the barrier layer on the contact opening sidewalls allows more space in the contact hole for the tungsten plug. This extra space is needed as the diameter of the contact plug opening is reduced.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a tungsten plug contact to a substrate using a selective tungsten chemical vapor deposition process with a self-aligned W-silicide barrier layer; comprising the steps of:
    a) forming a first insulating layer over a substrate; said substrate having a surface composed of silicon;
    b) forming a first opening in first first insulating layer exposing the surface of said substrate;
    c) selectively growing a first tungsten layer only on the exposed surface of said substrate;
    d) rapidly thermally annealing said substrate forming a first tungsten silicide layer from said first tungsten layer; and
    e) selectively depositing a tungsten plug only over said first tungsten silicide layer substantially filling said first opening.

2. The method of claim 1 wherein said first insulating layer having a thickness in a range of between about 4000 and 10,000 Å and composed of a three layer sandwich structure of Undoped Silicate Glass, borophosphosilicate glass and Undoped Silicate Glass.

3. The method of claim 1 wherein said first opening has an open dimension in a range of between about 0.15 and 0.2 $\mu$m.

4. The method of claim 1 wherein said first tungsten layer preferably has a thickness in a range of between about 200 and 500 Å.

5. The method of claim 1 wherein said first tungsten layer is selectively deposited using $H_2$ gas at a flow between about 1500 and 2500 sccm, and $WF_6$ at a flow between about 50 and 150 sccm, at a temperature between about 380 and 430° C. and at a pressure between about 150 mtorr and 250 mTorr.

6. The method of claim 1 wherein the rapid thermal anneal of said substrate is performed at a temperature in a range of between about 500 and 800° C. in an Ar gas flow, for a time in a range of between about 15 and 60 sec.

7. The method of claim 1 wherein the selectively deposition of said tungsten plug performed using $SiH_4$ and WF6 gasses with a $SiH_4$ to WF6 ratio in a range between about 0.55 and 1.3 and at a pressure in a range of between about 175 and 225 mtorr and at a deposition rate between about 4000 and 6000 Å/min.

8. The method of claim 1 wherein said tungsten plug has a thickness in a range of between about 5000 and 6000 Å.

9. A method of fabrication of a tungsten plug contact to a substrate using a selective tungsten chemical vapor deposition process with a self-aligned W-Silicide barrier; comprising the steps of:
    a) forming a first insulating layer over a substrate; said substrate having a surface composed of silicon;
    b) forming a first opening in said first insulating layer exposing the surface of said substrate;
    c) selectively growing a first tungsten layer only over the exposed substrate surface and not on said first insulating layer; said first tungsten layer having a thickness in a range of between about 200 and 500 Å;
    d) rapidly thermally annealing said substrate forming a first tungsten silicide layer from said first tungsten layer; the rapid thermal anneal of said substrate is performed at a temperature in a range of between about 500 and 800° C., in an Ar gas flow, for a time in a range of between about 15 and 60 sec; and
    e) selectively depositing a tungsten plug only over said first tungsten silicide layer substantially filling said first opening and not forming said tungsten plug over said first insulating layer.

10. The method of claim 9 wherein said first insulating layer has a thickness in a range of between about 4000 and 10,000 Å and composed of a three layer sandwich structure of a Undoped Silicate Glass layer, borophosphosilicate glass layer and a Undoped Silicate Glass layer.

11. The method of claim 9 wherein said first opening has an open dimension in a range of between about 0.15 and 0.2 $\mu$m.

12. The method of claim 9 wherein said first tungsten layer is selectively deposited using $H_2$ gas at a flow between about 1500 and 2500 sccm, and $WF_6$ at a flow between about 50 and 150 sccm, at a temperature between about 380 and 430° C. and at a pressure between about 150 mtorr and 250 mTorr.

13. The method of claim 9 wherein the selective deposition of said tungsten plug is performed using $SiH_4$ and WF6 gasses with a $SiH_4$ to WF6 ratio in a range between about 0.55 and 1.3 and at a pressure in a range of between about 175 and 225 mtorr, and at a deposition rate between about 4000 and 6000 Å/min.

14. The method of claim 9 wherein said tungsten plug has a thickness in a range of between about 5000 and 6000 Å.

15. A method of fabrication of a tungsten plug contact to a substrate using a selective tungsten chemical vapor deposition process with a self-aligned W-Silicide barrier layer; comprising the steps of:

a) forming first insulating layer over a substrate composed of silicon; said first insulating layer having a thickness in a range of between about 4000 and 10,000 Å and composed of a three layer sandwich structure of USG, borophosphosilicate glass and USG;

b) forming a first opening in said first insulating layer exposing the surface of said substrate;

c) selectively growing a first tungsten layer over the exposed substrate surface; said first tungsten layer having a thickness in a range of between about 200 and 500 Å; said first tungsten layer is selectively deposited using $H_2$ gas at a flow between about 1500 and 2500 sccm, and $WF_6$ at a flow between about 50 and 150 sccm, at a temperature between about 380 and 430° C. and at a pressure between about 150 and 250 mTorr;

d) rapidly thermally annealing said substrate forming a first tungsten silicide layer from said first tungsten layer; the rapid thermal anneal of said substrate performed at a temperature in a range of between about 500 and 800° C. in an Ar gas flow for a time in a range of between about 15 and 60 sec; and e) selectively depositing a tungsten plug over said first tungsten silicide layer substantially filling said first opening; the selectively deposition of said tungsten plug performed using $SiH_4$ and $WF_6$ gasses with a $SiH_4$ to WF6 ratio in a range between about 0.55 and 1.3 and at a pressure in a range of between about 175 and 225 mtorr and at a deposition rate between about 4000 and 6000 Å/min.

16. The method of claim 15 wherein said first opening has an open dimension in a range of between about 0.15 and 0.2 μm.

17. The method of claim 15 wherein said tungsten plug has a thickness in a range of between about 5000 and 6000 Å.

18. A method of fabrication of a tungsten plug contact to a substrate using a selective tungsten chemical vapor deposition process with a self-aligned W-Silicide barrier; comprising the steps of:

a) forming a first insulating layer over a substrate; said substrate having a surface composed of silicon;

b) forming a first opening in said first insulating layer exposing the surface of said substrate;

c) selectively growing a first tungsten layer on the exposed substrate surface and not on said first insulating layer; said first tungsten layer having a thickness in a range of between about 200 and 500 Å; said first tungsten layer is selectively deposited using $H_2$ gas at a flow between about 1500 and 2500 sccm, and $WF_6$ at a flow between about 50 and 150 sccm, at a temperature between about 380 and 430° C. and at a pressure between about 150 mtorr and 250 mTorr;

d) rapidly thermally annealing said substrate forming a first tungsten silicide layer from said first tungsten layer, the rapid thermal anneal of said substrate is performed at a temperature in a range of between about 500 and 800° C., in an Ar gas flow, for a time in a range of between about 15 and 60 sec; and e) selectively depositing a tungsten plug only over said first tungsten silicide layer substantially filling said first opening.

* * * * *